United States Patent [19]

Wilbert

[11] Patent Number: 4,795,948
[45] Date of Patent: Jan. 3, 1989

[54] VERTICAL DEFLECTION CIRCUIT WITH SERVICE MODE OPERATION

[75] Inventor: James A. Wilbert, Indianapolis, Ind.

[73] Assignee: RCA Licensing Corporation, Princeton, N.J.

[21] Appl. No.: 179,355

[22] Filed: Apr. 8, 1988

[51] Int. Cl.[4] .......................... H01J 29/70; H01J 29/76
[52] U.S. Cl. ......................................... 315/397; 358/10
[58] Field of Search ....................... 315/396, 397, 408; 358/10

[56] References Cited

U.S. PATENT DOCUMENTS 4,272,777  6/1981  Fitzgerald .
4,694,226  9/1987  Wilber .
4,731,564  3/1988  Pan et al. .

OTHER PUBLICATIONS

A technical manual, "The CTC 85 Color Chassis Technical Manual" dated 1977, pp. 35–44 and deflection and power supply drawing.
A technical manual "RCA CTC 136 Color Television Basic Service Data" dated 1986, pp. 1-16 to 1-20, cover sheet and a schematic drawing.
U.S. Application RCA Docket No. 84,965 entitled, Deflection Current Correction Circuit, in the name of J. A. Wilber, the applicant of the above captioned patent application, and filed concurrently herein.

Primary Examiner—Theodore M. Blum
Attorney, Agent, or Firm—Paul J. Rasmussen; Joseph J. Laks; Sammy S. Henig

[57] ABSTRACT

In a video display apparatus having a service mode of operation, a vertical deflection circuit includes a vertical deflection winding coupled to a DC blocking capacitor. An output stage is coupled to the vertical deflection winding at an output terminal. A vertical sawtooth voltage generator is coupled to a driver stage for driving the output stage at a vertical rate in a sawtooth manner to generate a sawtooth deflection current in the deflection winding and for establishing a DC operating voltage level at the output terminal that charges the DC blocking capacitor. The sawtooth generator includes a second capacitor that, during normal operation, is charged in a sawtooth manner via a resistor for developing a sawtooth signal. A service mode switching circuit is coupled to the resistor for asserting the service mode of operation by preventing the charging of the second capacitor via the resistor. A DC feedback loop maintains the DC blocking capacitor charged during the service mode.

9 Claims, 1 Drawing Sheet

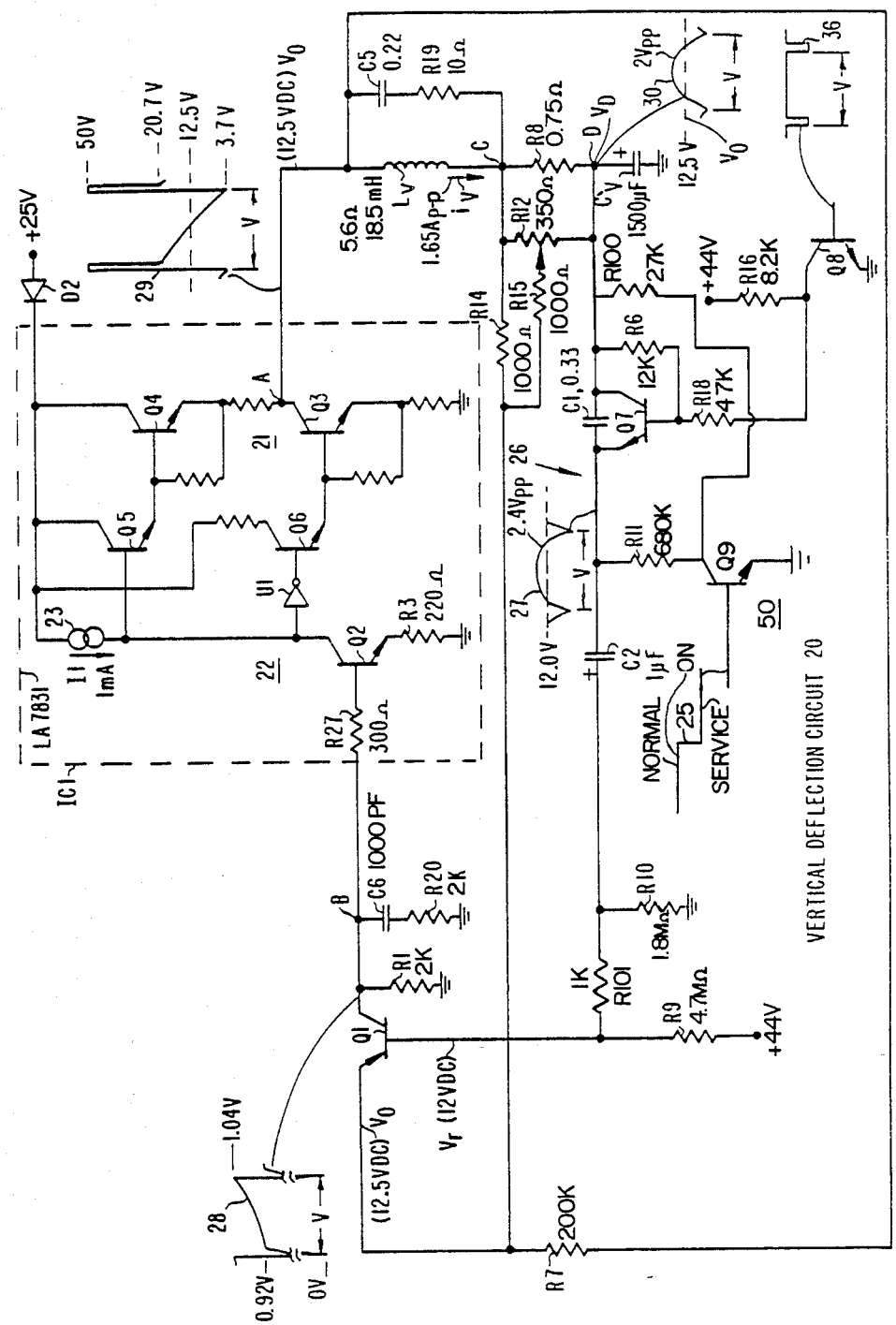

VERTICAL DEFLECTION CIRCUIT WITH SERVICE MODE OPERATION

This invention relates to a vertical deflection circuit with service mode operation.

To manually adjust the color temperature in a television receiver or a video display apparatus, various circuits in the television receiver are disabled including the vertical deflection circuit. The vertical deflection circuit is disabled in order to collapse the raster into a single horizontal line. A service switch that may operate under a control of a microcomputer may be used to disable the vertical deflection circuit for preventing the generation of vertical deflection current.

A typical vertical deflection circuit may include a push-pull output stage, and a vertical deflection winding interposed between the output stage and a DC blocking capacitor. During normal operation, a DC voltage is developed in the DC blocking capacitor. The DC voltage in the DC blocking capacitor is controlled in a DC feedback loop and is used for energizing an AC vertical sawtooth generator that generates a sawtooth output signal. The sawtooth signal is coupled to an input terminal of the push-pull output stage.

In accordance with a feature of the invention, a service mode circuit arrangement is provided that maintains the DC blocking capacitor charged during service mode of operation. Maintaining the DC blocking capacitor so charged may be desirable so as to reduce loading of the power supply by the large blocking capacitance during a transition from operation in service mode to operation in normal mode. Excessive loading of the power supply by the capacitor during such transition may cause squegging to occur in certain types of power supplies, disadvantageously, resulting in a disturbed picture on a cathode ray tube (CRT) of the television receiver.

The output stage includes first and second output amplifiers coupled to the vertical deflection winding at an output terminal in a push-pull arrangement. The first and second output amplifiers are respectively coupled to a source of supply voltage and to a common potential which may be referred to as ground.

In accordance with another feature of the invention, the vertical sawtooth voltage generator includes a second capacitor having a first terminal that is coupled to the DC blocking capacitor. A second terminal of the second capacitor is coupled to ground via a series arrangement of a resistor and a service mode switch when the service mode switch is conductive. During the service mode of operation, the service mode switch that is nonconductive prevents the charging of the second capacitor. The sawtooth signal developed between the resistor and the second capacitor is coupled to a driver stage for driving the output stage at a vertical rate in a sawtooth manner to generate a sawtooth vertical deflection current and establish a DC operating voltage level in the DC blocking capacitance that is coupled to the output terminal. A DC feedback controls the DC operating voltage in the DC blocking capacitance. Advantageously, the DC feedback loop operates during the service mode so as to maintain the DC blocking capacitor charged.

In accordance with a further feature of the invention, the sawtooth generator includes a second switch operating at a vertical rate during both the normal and service modes of operation. The second switch that is coupled across the second capacitance maintains the frequency response of an AC feedback loop in the deflection circuit substantially the same during both modes of operation. Therefore, advantageously, the frequency response, once optimized for normal mode of operation, is unlikely to cause instability in the AC feedback loop during the service mode of operation.

In accordance with an aspect of the invention, a vertical deflection circuit of a video display apparatus that has normal and service modes of operation includes a vertical deflection winding and an amplifier responsive to a sawtooth signal generated in a sawtooth generator. The amplifier includes a driver stage that is coupled to the deflection winding for generating, during normal operation, a sawtooth deflection current in the deflection winding. The sawtooth signal generator includes a source of a first voltage developed during the normal and during the service modes of operation. It include a first capacitance coupled to the source of the first voltage. It also includes a source of a first control signal at a frequency that is related to a deflection frequency. A first switch of the sawtooth generator is responsive to the first control signal and coupled to the first capacitance. The first switch operates at a frequency that is related to that of the first control signal during both the normal mode of operation and the service mode operation. The first switch discharges, in the normal mode of operation, the first capacitance during a first portion of a given period of the first control signal. A second control signal has a first state that is indicative when the normal mode of operation is required and a second state when the service mode of operation is required. A controllable impedance responsive to the second control signal and coupled via the first capacitance to the source of the first voltage provides, in the normal mode of operation, a current path to a current that charges the first capacitance during a second portion of the given period. The sawtooth signal is produced at a second terminal of the first capacitance. The controllable impedance decouples the current path from the second terminal of the first capacitance when the second control signal is at the second, service mode operation state to prevent the charging of the first capacitance for preventing the generation of the sawtooth signal and the deflection current.

The sole FIGURE illustrates a vertical deflection circuit with service mode operation, embodying the invention.

In the illustrated vertical deflection circuit 20 for a television receiver or a video display apparatus, a vertical deflection winding $L_V$ is coupled to a vertical amplifier output stage 21 at an output terminal A. A current sampling resistor R8 is coupled to deflection winding $L_V$ at a terminal C, and a DC blocking and S-shaping capacitor $C_V$ is coupled to resistor R8 at a terminal D.

Vertical output stage 21 includes a top amplifier transistor Q4 coupled to a +25V DC supply via a diode D2 and a bottom amplifier transistor Q3 coupled to a ground reference potential point. A driver stage 22 is coupled to output stage 21 for driving the output stage at a vertical rate in a sawtooth manner to generate a sawtooth vertical deflection current $i_V$ in vertical deflection winding $L_V$.

Driver stage 22 includes an inverting amplifier, driver transistor Q2, and a current source 23 coupled to the collector of the transistor. Driver transistor Q2 drives top output transistor Q4 via a noninverting buffer transistor Q5 and drives bottom output transistor Q3 via an inverting stage U1 and a noninverting buffer transistor Q6. The driver and output stages may be incorporated into an integrated circuit, IC 1, such as the LA7831, manufactured by Sanyo Corporation.

To generate a vertical sawtooth current $i_V$ in vertical deflection winding $L_V$, a vertical ramp generator 26 generates a vertical ramp generating voltage 27 that is AC coupled by a capacitor C2 to the base of an error amplifier transistor Q1. Error amplifier transistor Q1 inverts vertical ramp voltage 27 to develop a vertical input voltage 28 across a collector load resistor R1 of transistor Q1. Input voltage 28 is applied to an input terminal B of driver stage 22 that is coupled to the base of inverting amplifier transistor Q2 via a resistor R2.

Vertical input voltage 28 progressively increases the conduction of driver transistor 22 during the vertical trace interval, progressively shunting more of current I1, developed by current source 23, away from top output amplifier portion Q5 and Q4. During the first half of trace, output transistor Q4 is conducting, to couple the +25V supply to vertical deflection winding $L_V$ via diode D2. A decreasing vertical deflection current $i_V$ flows in deflection winding $L_V$ and charges DC blocking capacitor $C_V$ from the +25V supply via transistor Q4.

During the second half of vertical trace, driver transistor Q2 has been made sufficiently conductive by input voltage 28 to turn off top output transistor Q4 and turn on bottom output transistor Q3. DC blocking capacitor $C_V$ discharges to ground via vertical deflection winding $L_V$ and transistor Q3, thereby generating the negative sawtooth portion of vertical deflection current $i_V$.

To initiate the vertical retrace interval, input voltage 28 turns off driver transistor Q2, thereby turning off bottom output transistor Q3 and turning on top output transistor Q4. Conventional vertical retrace circuitry, not illustrated in the FIGURE, provides for the retrace of vertical deflection current $i_V$.

The operation of output stage 21 in response to vertical input voltage 28, develops a vertical output voltage 29 at output terminal A that is applied to vertical deflection winding $L_V$. The DC level, $V_0$, established at output terminal A, also establishes the same DC level at terminals C and D. Vertical deflection current $i_V$ generates an AC sawtooth voltage between terminals C and D, across sampling resistor R8, and generates a parabolic component 30 to the voltage $V_D$ developed across DC blocking capacitor $C_V$.

A DC negative feedback loop from output terminal A to input terminal B stabilizes the average DC operating voltage level at terminal A. The voltage at terminal A is coupled via terminal C to the emitter of error amplifier transistor Q1 to establish the DC voltage of the emitter at voltage level $V_0$. Voltage level $V_0$ is compared with a reference voltage level $V_r$ that is developed at the base of transistor Q1 by voltage dividing resistors R9, R101 and R10. The level of input voltage 28 is controlled by the conduction of transistor Q1 for stabilizing the DC voltage level $V_0$ at an operating level that is approximately 1$V_{be}$ above reference voltage level $V_r$.

AC negative feedback for scan linearization is provided by coupling the AC sawtooth voltage developed across sampling resistor R8 to the emitter of error transistor Q1 via a voltage dividing network comprising potentiometer R12 and resistors R14 and R15. The AC sawtooth voltage at the emitter of error transistor Q1 is compared against reference ramp voltage 27 that is AC coupled to the base of the transistor in order to develop the AC component of input voltage 28. Deflection current amplitude is adjusted by adjusting the wiper arm of potentiometer R12.

Ramp generator 26, that develops AC reference ramp voltage 27, comprises an RC integrating network, capacitor C1 and a resistor R11. During normal operation, resistor R11 has a terminal that is coupled to ground via a collector of a transistor Q9 that is conductive during normal operation. A reset switch, transistor Q7, is coupled across capacitor C1. Voltage $V_D$ developed across DC blocking capacitor $C_V$ is applied to the integrating network of capacitor C1 and resistor R11. The DC component of voltage $V_D$ is integrated by capacitor C1 to generate a downwardly-going ramp of voltage across resistor R11. The AC, parabolic component of voltage $V_D$ is integrated by capacitor C1 to provide S-shaping of the ramp voltage across resistor R11.

To initiate vertical retrace, ramp capacitor C1 is discharged by making reset transistor Q7 conductive. A vertical reset pulse 36, generated by vertical synchronization circuitry not illustrated in the FIGURE, is applied to the base of a transistor Q8, making the transistor nonconductive during the short reset pulse interval. The collector of transistor Q8 is coupled to a +44V supply by a resistor R16. The collector of transistor Q8 is DC coupled to the base of reset transistor Q7 via a resistor R18. Negative going reset pulse 36 is inverted by transistor Q8 and applied to the base of transistor Q7, to turn transistor Q7 on and discharge capacitor C1. The sharp increase in ramp voltage 27 when capacitor C1 is discharged is coupled to the base of error amplifier transistor Q1 and turns the transistor off to initiate the vertical retrace interval.

A capacitor C5 in series with a resistor R19 across deflection winding $L_V$ damps deflection winding resonances. A resistor R7 is coupled between output terminal A and the emitter of error amplifier transistor Q1 to compensate for horizontal rate pickup by vertical deflection winding $L_V$. A capacitor C6 in series with a resistor R20 is coupled between input terminal B and ground to roll off the gain at higher frequencies to prevent deflection circuit high frequency oscillation.

During service mode operation of the television receiver used, for example, when color temperature is to be manually adjusted, or when degaussing is required, the raster is collapsed vertically by disabling vertical deflection circuit 20.

In accordance with a feature of the invention, a service mode switching circuit 50 disables the generation of vertical deflection current when the service mode of operation is asserted. Service mode switching circuit 50 includes service mode switching transistor Q9 having its collector coupled to an end terminal of resistor R11 that is remote from the junction between capacitors C2 and C1. A resistor R100 is coupled between terminal D of capacitor $C_V$ and the collector of transistor Q9. The emitter of transistor Q9 is coupled to ground.

During the normal mode of television receiver operation, a mode-switching signal 25, that may be conventionally generated, is in the high state, maintaining transistor Q9 in saturated conduction. Therefore, ramp generator 26 operates in the manner described before.

To assert the service mode of television receiver operation, mode-switching signal 25 is switched to the low state to cutoff conduction in transistor Q9. With transistor Q9 cutoff, the current path via resistor R11 for charging capacitor C1 is opened. Therefore, capacitor C1 can no longer be charged and the plate of capacitor C2 that is coupled to capacitor C1 will be at the level of voltage $V_D$. Consequently, generation of ramp voltage 27 ceases. Resistor R100 prevents leakage current from charging capacitor C1.

Due to the DC negative feedback provided by resistors R14, R15 and R12, the DC voltage at each of terminals A, C and D will be maintained at approximately +12.5 volts, that is approximately equal to reference voltage level $V_r$ plus one $V_{be}$ voltage of transistor Q1.

Therefore, in accordance with an aspect of the invention, capacitor $C_v$ will be maintained charged to approximately +12.5 volts during service mode of operation by the operation of transistor Q9. Consequently, when normal mode of operation is resumed, the transient supply current via diode D2 is, advantageously, smaller than if capacitor $C_V$ were not already charged.

In accordance with another aspect of the invention, an AC feedback-loop path between the input and output of IC 1 includes capacitor C1 in parallel with switching transistor Q7. Because transistor switch Q7 operates during both the normal and service modes of operation, the frequency response characteristic of the feedback loop is substantially the same in both modes of operations. Therefore, advantageously, the frequency response characteristic once optimized for normal mode of operation, is unlikely to cause instability in the AC feedback-loop during the service mode of operation. Had the AC feedback-loop been unstable during the service mode of operation, an AC signal might have been generated that might have caused a disturbance in the vertical direction in the raster on the CRT screen.

What is claimed:

1. A vertical deflection circuit of a video display apparatus having normal and service modes of operation, comprising;
   a vertical deflection winding;
   an amplifier responsive to a sawtooth signal and having a driver stage that is coupled to said deflection winding for generating, during normal operation, a sawtooth deflection current in said deflection winding; and
   a sawtooth signal generator for generating said sawtooth signal, said sawtooth signal generator including:
   a source of a first voltage developed during said normal and during said service modes of operation;
   a first capacitance coupled to said source of said first voltage;
   a source of a first control signal at a frequency that is related to a deflection frequency;
   a first switch responsive to said first control signal and coupled to said first capacitance, said first switch operating at a frequency that is related to that of said first control signal during both said normal mode of operation and said service mode operation, for discharging, in said normal mode of operation, said first capacitance via said first switch during a first portion of a given period of said first control signal;
   a source of a second control signal having a first state that is indicative when said normal mode of operation is required and a second state when said service mode of operation is required; and
   a controllable impedance responsive to said second control signal and coupled via said first capacitance to said source of said first voltage for providing, in said normal mode of operation, a current path to a current that charges said first capacitance during a second portion of said given period to produce said sawtooth signal at a second terminal of said first capacitance, and for decoupling said current path from said second terminal of said first capacitance when said second control signal is at said second, service mode operation state to prevent the charging of said first capacitance for preventing the generation of said sawtooth signal and said deflection current.

2. An apparatus according to claim 1 wherein said source of said first voltage comprises a DC blocking capacitance that is DC coupled to said driver stage via said deflection winding for developing said first voltage across said DC blocking capacitance.

3. An apparatus according to claim 2 wherein said first voltage is a DC voltage and wherein said controllable impedance provides said current path that conducts a DC current from said DC blocking capacitance via said first capacitance during said second portion of said given period in said normal operation.

4. An apparatus according to claim 1 wherein said first switch is coupled in parallel with said first capacitance for discharging said first capacitance therethrough during said first portion of said given period.

5. An apparatus according to claim 1 wherein said controllable impedance comprises a second switch responsive to said second control signal and a first resistance coupled in series with said second switch, said second switch being nonconductive in said service mode of operation to prevent said first capacitance from charging via said first resistance.

6. An apparatus according to claim 5 further comprising, a second resistance having a first terminal that is coupled to a terminal that is coupled between said first capacitance and said source of said first voltage, said second resistance having a second terminal that is coupled at a junction terminal between said second switch and said first resistance.

7. An apparatus according to claim 1 further comprising, a second DC blocking capacitance having a first terminal that is coupled to a terminal of said first capacitance that is remote from said source of said first voltage and a second terminal that is coupled to an input terminal of said amplifier for coupling said sawtooth signal to said amplifier.

8. An apparatus according to claim 1 further comprising, a deflection current sampling resistor coupled to said deflection winding and an error amplifier responsive to said sawtooth signal and to a signal that is developed across said sampling resistor for generating an AC error signal in accordance with a difference therebetween that is coupled to said input terminal of said amplifier.

9. An apparatus according to claim 1 wherein a first terminal of said first capacitance is coupled to an output terminal of said amplifier and a second terminal of said first capacitance is coupled to an input terminal of said amplifier such that an AC feedback signal path from said output to said input terminal of said amplifier, that includes said first switch and said first capacitance, has substantially the same characteristic during both normal and service modes of operation.

* * * * *

UNITED STATES PATENT AND TRADEMARK OFFICE
CERTIFICATE OF CORRECTION

PATENT NO. : 4,795,948

DATED : January 3, 1989

INVENTOR(S) : JAMES ALBERT WILBER

It is certified that error appears in the above-identified patent and that said Letters Patent is hereby corrected as shown below:

In the front page, the following item "[75] Inventor:

James A. Wilbert" should read -- [75] Inventor:

James A. Wilber --. item [19] "Wilbert" should read -- Wilber --.

Signed and Sealed this

Seventh Day of November, 1989

*Attest:*

JEFFREY M. SAMUELS

*Attesting Officer*     *Acting Commissioner of Patents and Trademarks*